United States Patent [19]

Taylor et al.

[11] 4,169,993
[45] Oct. 2, 1979

[54] INTERCEPT RECEIVER FOR DOUBLE-SIDE-BAND, NOISE-LIKE SIGNALS

[75] Inventors: Richard L. Taylor, Bladensburg, Md.; Ralph D. Drosd, deceased, late of Kensington, Md.; by Luther W. Gregory, administrator, Arnold, Md.

[73] Assignee: The United States of America as represented by the Secretary of the Air Force, Washington, D.C.

[21] Appl. No.: 607,604

[22] Filed: Jan. 4, 1967

[51] Int. Cl.² .............................................. H04B 1/32
[52] U.S. Cl. .................................. 325/470; 325/329; 325/335; 325/434; 325/438; 325/453
[58] Field of Search ............... 325/430, 431, 433, 434, 325/438, 453, 473, 332, 333, 335, 329, 470, 469; 331/19, 30, 31

[56] References Cited

U.S. PATENT DOCUMENTS

| 3,045,625 | 7/1962 | Smith, Jr. | 325/332 |
| 3,110,861 | 11/1963 | Hurvitz | 325/332 |
| 3,140,443 | 7/1964 | Wimberly | 325/335 |

FOREIGN PATENT DOCUMENTS 487814 11/1952 Canada ..................................... 325/332

*Primary Examiner*—Howard A. Birmiel
*Attorney, Agent, or Firm*—Joseph E. Rusz; Robert Kern Duncan

[57] ABSTRACT

A receiver for detecting a double side-band noise like signal, in which the receiver is swept over a defined RF spectrum of interest, a phase inversion of the double side band signal is provided and multiplied with the received double side-band noise-like signal to produce an IF signal, and correlation circuitry is provided to produce an output whereby the presence of the double side-band noise like signal is detected, and controls the stopping of the sweep at said detection.

2 Claims, 1 Drawing Figure

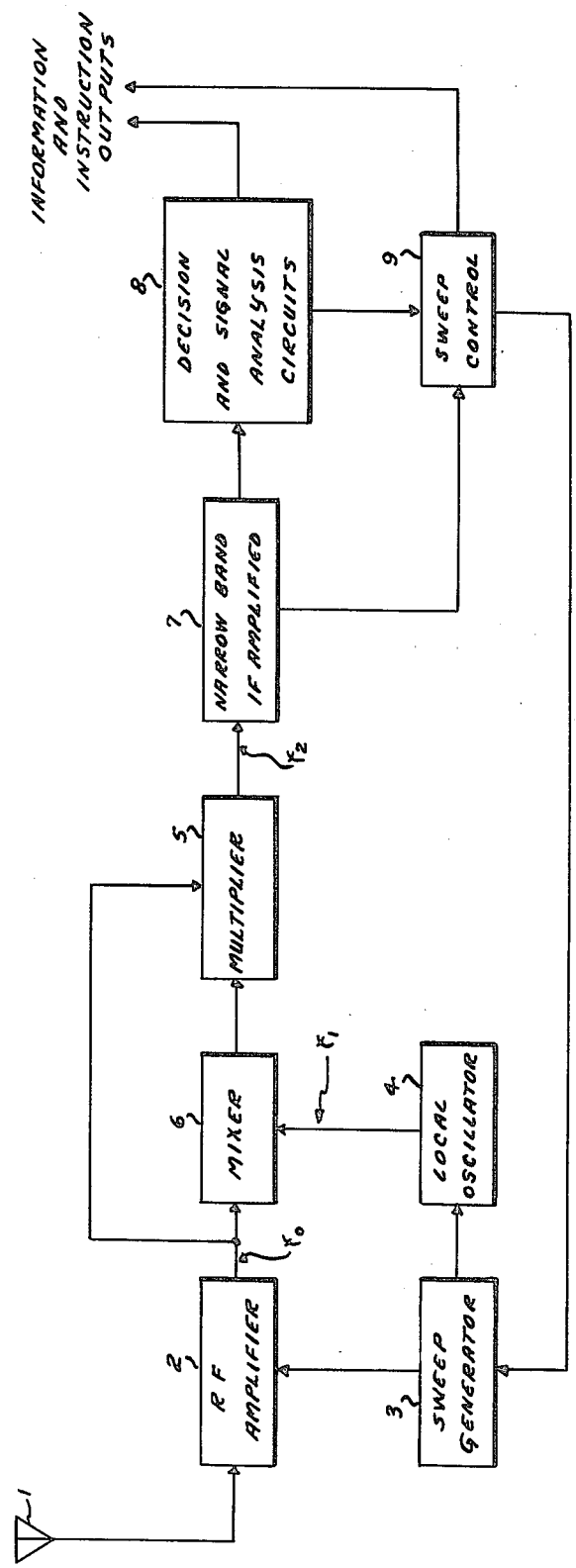

INTERCEPT RECEIVER FOR DOUBLE-SIDE-BAND, NOISE-LIKE SIGNALS

This invention relates to radio communication receivers, and more particularly to intercept receivers for detecting the presence of a radio communication signal.

Particularly in military communication it is desirable to communicate messages and data without the information contained therein being available to the enemy. For many years it has been commonplace to encode messages, scramble the communicating signal, and the like in order to preserve secrecy. But, this type of transmission is readily apparent to the enemy and is very susceptible to disruption by jamming signals. In recent years the trend is to not only preserve the secrecy of the message but also the secrecy of the transmission, i.e., the fact that a message is being transmitted. To accomplish this, the trend in military radio communication is toward the use of wide-band, noise-like signals which are difficult to detect by means of conventional receivers.

Systems that use signals resembling random noise for the transmission of information all have one property in common: they radiate signals with a much greater bandwidth than that required by the information rate of the system. For instance, the system may be required to handle data at the rate of the thousand bits per second. The minimum bandwidth for any data transmission system to meet this requirement is 1000 cycles per second, but a system incorporating noise-like signals and correlation reception will use a bandwidth $10^4$ times (or more) larger than the minimum required. Such systems are often referred to as large WT systems, where WT is the product of transmission bandwidth (W) and the inverse of information baud length (T). The power radiated by the transmitter is thus spread over a large portion of the frequency spectrum, and the signal power spectral density per unit bandwidth at the receiver input may be much less than the interference (generally noise) spectral density. Thus the input signal-to-noise ratio may be considerably less than unity. The correlation process built into the receiver has the effect of collapsing the signal spectrum into a much smaller bandwidth (normally equal to the information bandwidth) while the interference spectrum remains spread out. By concentrating the information signal power into a smaller bandwidth while keeping the interference power distributed, an improvement in the signal-to-noise ratio is realized.

The receiver for these noise-like signals utilizes a correlation techniques as the means to concentrate the signal energy in the smaller bandwidth. To detect the information signal, the receiver is required to have available a second, or reference, copy of the signal. The two copies are compared, or cross correlated, and there results the frequency compression phenomenon referred to earlier. There are several techniques for providing the reference signal to the receiver and the particular technique used by a particular data link system determines a number of the properties of the signal that the transmitter must generate. There are three basic means that exist for delivering the reference message to the receiver. These are the stored reference method, the frequency-diversity transmitted reference method, and the time-diversity transmitted reference methods.

There are two general characteristics of all systems designed for data communication via noise-like signals. The transmitted signal bandwidth is finite because of practical limitations, and it is very much greater than the information bandwidth.

From the viewpoint of providing a jammer, the most difficult signal to distinguish from noise is the stored reference data link signal. The frequency-diversity transmitted reference method requires two identical signals to be transmitted on two different channels. This signal characteristic distinguishes it from random noise. The time-diversity transmitted reference method uses two identical signals separated by a short delay time and transmitted in the same frequency channel. The time delay distinguishes this signal from random noise.

It may be concluded that the stored reference type of data link system is one of the most difficult to detect and jam. Detection by means of ordinary receivers or even sophisticated radiometric receivers is impractical. All common jamming signals are ineffective except at very high power levels. It is thus believed that this type of communication system will be, or is, used by the enemy.

The stored reference data link receiver recognizes only certain signals. These signals are similar to wide-band noise but have a definite pattern. A copy of this pattern is stored in the receiver. Any other pattern is rejected by the receiver by a power factor of about 20 db. Furthermore, even if the signal has the proper pattern it must be in synchronism with the stored reference signal in the receiver or it will be rejected. There are two general methods of operating a stored reference data link system. Each has its own antijam features. In one method, the transmitter is operated at a power level as low as reliable reception permits. The result is that the signal is buried in the ambient noise by about 20 db. The antijam feature of this method is that, hopefully, the data link signal will escape detection by an intercept receiver. Without the information provided by an intercept receiver, a jammer cannot be effective except by the expenditure of impractical amounts of power over all possible frequencies.

The other method of operating the data link system is to use high powered transmission. Here, the antijam feature is the capability of the receiver to discriminate against all common jammer signals such as noise except those with the proper pattern and synchronization. In practical cases, this places the jammer at about 20 db power advantage.

There are three different means of transmitting the signal in a stored reference data link system. These are frequency modulation (FM), single side-band modulation (SSB), and double side-band suppressed carrier (DSSC) modulation. FM is not expected in a jamming environment since it is more susceptible to noise than DSSC at low S/N (signal to noise) ratios. SSB is best from this viewpoint, but it requires more circuitry to prevent distortion due to frequency instability and doppler shifts. These would add to the already difficult problems of synchronization of the data link system. DSSC avoids these complexities and is therefore expected to be the modulation method used in opposing military communication systems, at least in the first generation of stored-reference data link systems.

A brief explanation of how a DSSC system operates in a stored-reference link system is as follows. One side band may be considered the information signal and the other side band the reference signal. Thus, the information and reference are not exactly identical, but they are very definitely related. When a double side band signal is mixed with the output of a local oscillator whose frequency is higher than the highest information signal frequency, the effect is to invert the signal such that the lower side band of the mixer input becomes the upper side band of the mixer output and vice versa. Also, the phase relationships are altered so that the mixer output is an exact replica of the input and will correlate with it. Any noise mixed with the local oscillator frequency is also inverted. However, the inverted noise is not identical to the uninverted noise (the noise being SSB in characteristic) and therefore will not correlate with it. It is, therefore, possible to detect double side band signals with simple one-dimensional frequency search.

While the foregoing information is primarily background material for this invention it should enable those skilled in the art, and particularly those skilled in the art that have not had available the "classified" art, to comprehend this invention. To somewhat reiterate, military communications are taking place with noise-like signals. Some military services have available data link systems using DSSC noise-like signals. Where the communication is between friendly stations utilizing prearranged frequencies, bandwidths, time of transmission, directive radiation devices and other known techniques, transmission and reception are readily accomplished.

It is anticipated that opposing military forces sometime in the future, if not at present, will have available and be using similar techniques. This raises difficulties for friendly military operations in the fields of reconnaissance, surveillance and jamming. Obviously reconnaissance and surveillance of enemy electromagnetic radiation is impossible without a reliable method of detection. At the present state of the art the only techniques for the detection of the signal are (1) narrow beam antennas and (2) radiometric receivers. Narrow beam antennas, in theory, can eliminate much of the atmospheric noise. However, a narrow beam antenna presupposes that the location of the transmitter is known or that the antenna can be scanned rapidly enough to intercept the signal. In general, the location is not known and the signal is too short to be intercepted in this manner. The radiometric technique relies on integrating the (noise-like) signal and (normal) noise over a sufficiently long time to establish the slight increase in power received due to the presence of a signal. This requires integration times of many seconds. This is impractical since the message may be for less than a second in duration. Thus, jamming these noise-like signals is impractical without an intercept receiver to locate and determine the carrier frequency of the signal to be jammed. The providing of such an intercept receiver is an object of this invention.

Additional objects, features, and advantages of this invention will become apparent to those skilled in the art after comprehending the following decription of an embodiment of the invention to be read in connection with the drawing in which:

FIG. 1 is a block diagram of an embodiment of an intercept receiver.

The signal information output of the intercept receiver herein disclosed will be used in many ways. Surveillance, reconnaissance, and jamming are readily apparent. The jamming may be by a phase displaced repeater signal, noise-on-noise or other means. However, it is to be understood that after the intercept receiver has located in the frequency spectrum the transmission signal and detected the information signal of the transmission, that the utilizaton of the output of the intercept receiver is not a part of this invention.

Referring to the drawing, antenna 1, which may be a wide-band and broadly directional antenna, feeds into a wide-band RF amplifier 2 that is electronically tunable over a defined frequency spectrum range expected of containing noise-like signals. Such RF amplifiers are common and well known. During the search phase of detection the receiver is driven by the sweep generator 3 such that the receiver examines all possible signal channels in as short a time as possible. The precise sweep rate used is a function of the mode of operation of the jammer employed, the anticipated message length of the transmission it is desired to intercept, and the desired probability of detection. It is highly desirable, however, to set the minimum sweep rate as that which will allow inspection of all possible channels of operation within a length of time corresponding to the expected or known data link message length.

Sweep generator 3, in addition to sweeping the RF amplifier, sweeps the local oscillator 4. The frequency of the local oscillator is made higher than the center frequency of the frequency being searched for a data link signal and it is swept in the same direction as the input band width is swept in the RF amplifier, but at twice the rate. It is necessary to sweep the local oscillator at twice the input scan rate to maintain a constant IF (intermediate frequency).

Following the RF amplification stage, the incoming signal is split in two channels. One channel is fed directly into the correlation multiplier 5, while the other channel is mixed in the mixer stage 6 with the output of the local oscillator 4. The frequency $f_1$ of the local oscillator is adjusted, or set, such that at all times the instantaneous frequency relationships are $$2f_o - f_1 = f_2$$

where
$f_o$ = center frequency of input bandwidth
$f_1$ = local oscillator frequency
$f_2$ = intermediate frequency The only restriction of this relationship is that $f_1$ must be greater than $f_o$ for proper detection of signals by the receiver. When the local oscillator output is mixed with the input signals (after RF amplification), the input spectrum is effectively shifted up and down in frequency by the amount $f_1$. The particular result of interest is the spectrum that appears centered at the difference frequency $f_1 - f_o$. Because $f_1$ is greater than $f_o$ the order of the side bands at the output of the mixer reversed. The upper side band at $f_o$ becomes the lower side band at $f_1 - f_o$ and similarly the original lower side band becomes the difference spectrum upper side band. Thus, the difference spectrum is an exact replica of the original input spectrum, but its upper and lower side bands are derived from the lower and upper side bands, respectively of the original signal. This process may be referred to as spectrum inversion.

Any random noise that appears at the input also undergoes this inversion process when mixed with the local oscillator output. However, random noise is single side band in character such that the inversion produces a mirror image of the original spectrum and not a duplicate. An inverted spectrum single side-band signal will not correlate with an uninverted copy, but an inverted spectrum double side-band signal, since it is an exact replica of the original signal, correlates to a high degree (within equipment component limitations), with the original signal.

Following the mixer stage, the inverted signal from the mixer and uninverted signal from the RF amplifier are multiplied. A double side-band signal in the input will yield a sinusoidal signal at the multiplier output of frequency $2f_o - f_1 = f_2$. This sinusoidal signal is caused by the in-phase addition of difference frequency components resulting from multiplication of corresponding frequency components of the inverted and uninverted double side band spectra. Thus, the output of the multiplier contains the signals centered about the IF frequency. The bandwidth of the IF amplifier determines the integration time and in cooperation with the multiplier completes the correlation process. The difference frequency components at $f_2$, due to multiplication of the inverted and uninverted random noise spectrum are not phase coherent, but rather have their phases randomly distributed such that the average signal amplitude resulting from the noise spectrum is zero.

Once the inverted spectrum of the double side band signal input has been produced, the receiver operates in a manner similar to the conventional receiver of a transmitted reference, frequency diversity data link system. Thus, as the input is tuned across a suitable signal, a pulse appears at the outputs of the narrow band IF amplifier 7. This pulse is fed into the sweep control unit 9 which causes the sweep generator 3 to pause, stop, or back-up slightly to look again at the spectral region that caused the pulse. Simultaneously an output is furnished by the sweep control circuit indicating the radio frequency being searched by the intercept receiver at that instant. The decision circuits 8 then examine the correlated output from the IF amplifier to conclude signal presence or absence. If an affirmative decision is reached, the signal is examined further by limiting the sweep through the sweep control to effectively "bracket" the signal thus determining its bandwidth and center frequency. Concurrently, the information signal carried by the transmission is available for further utilization at the output.

The structure and components represented by the blocks in the FIGURE are all well known in the art. The electronic sweeping of amplifiers and oscillators has been known for many years. Electronic mixer stages, wherein upper and lower side bands composed sum and difference signals are created, data back to the superheterodyne. Spectrum inversion technique is well known, but not as applied herein. Electronic multipliers have been available in the patent literature for approximately twenty years. One of the earliest and commonest form of electronic multiplier for two signals, such as a and b, first adds the signals providing the sum $a+b$. The summation is then electronically squared, i.e., $(a+b)^2$, yielding $a^2 + 2ab + b^2$, from which the $a^2$ and $b^2$ components are filtered out providing a signal proportional to the multiplication of the orignual signals. The mathematical analysis of electronic multipliers has been published many times. It is not intended that this invention be limited to any particular multiplier or multiplying process, such as just outlined, but that advanced multipliers currently available may be readily employed by those skilled in the art in practicing this invention. Intermediate frequency amplifiers having wide ranges of frequency of operation and pass-band characteristics are extremely well known, as are voltage sweep generators and sweep control circuits. Decision and signal analysis devices that indicate, register, and analyze the presence of a desired signal are used extensively throughout the radar and communication art. The invention herein disclosed resides in the unique utilization and combination of well-known structural elements to provide a new device.

What is claimed is:

1. An intercept receiver system for double-side-band, noise-like radio frequency signals comprising: wide-band antenna means for collecting the radio frequency signals; voltage tunable wide-band radio frequency amplification means cooperating with the said antenna means for amplifying the said double side-band noise-like radio frequency signals; controllable sweep voltage generating means providing a sweep voltage; connecting means cooperating with the said controllable sweep generation means and the radio frequency amplification means for sweeping the said wide-band radio frequency amplification means through a defined radio frequency spectrum providing an instantaneous wide-band center frequency designated as $f_o$; voltage controllable local oscillator means for providing a signal designated as $f_1$ that is greater in frequency than $f_o$; connecting means cooperating with the said sweep generator means and the said voltage controllable local oscillator means for sweeping the said local oscillator at twice the frequency rate that said bandwidth in the radio frequency amplifiers is swept; radio frequency mixing means cooperating with the said local oscillator means and the said radio frequency amplification means providing a signal having a spectrum inversion of the said double-side-band, noise-like, radio frequency signal; multiplying means cooperating with the said mixing means and the said radio frequency amplifying means for providing a product signal at an intermediate frequency designated $f_2$, having the relationship $2f_o - f_1 = f_2$; narrow band intermediate frequency amplification means, centered about the frequency $f_2$, for integrating the said product signal and providing a correlation output of the said double-side-band noise-like signal and the said signal having a spectrum inversion of the double-side-band noise-like signal; decision and signal analysis means responsive to the said correlation output of the intermediate amplification means for providing a signal information output; and sweep control means responsive to the said output of the intermediate frequency amplifier and the said decision and signal analysis means for controlling the said sweep generator means and providing an information output indicating the radio frequency being searched by the said intercept receiver.

2. In an intercept receiver for detecting a double-side-band noise-like signal in a defined portion of the radio frequency spectrum, the said receiver comprising: means for sweeping the said receiver over the said defined radio frequency spectrum; means for providing a signal having a phase inversion of the said double side-band noise-like signal; means for multiplying the said signal having a phase inversion and the said double-like-band noise-like signal for providing an intermediate frequency signal; narrow band intermediate frequency amplifying means cooperating with the said multiplying means for providing a correlation output signal of the said double-side-band signal and phase inverted signal whereby the presence of a double-side-band noise-like signal is detected; and means cooperating with the said intermediate frequency amplifying means and the said sweeping means for stopping the sweep when a signal is detected.

* * * * *

UNITED STATES PATENT AND TRADEMARK OFFICE
CERTIFICATE OF CORRECTION

PATENT NO. : 4,169,993

DATED : October 2, 1979

INVENTOR(S) : Richard L. Taylor and Ralph D. Drosd, deceased

It is certified that error appears in the above—identified patent and that said Letters Patent are hereby corrected as shown below:

Col. 5, line 45, change "data" to -- date ---. Col. 6, lines 56 and 57, change "double-like-band" to -- double-side-band --.

Signed and Sealed this

Fifth Day of February 1980

[SEAL]

Attest:

SIDNEY A. DIAMOND

Attesting Officer

Commissioner of Patents and Trademarks